(12) United States Patent
Han et al.

(10) Patent No.: US 10,290,493 B2
(45) Date of Patent: May 14, 2019

(54) METHOD FOR MANUFACTURING SILICON-CONTAINING THIN FILM

(71) Applicant: UP CHEMICAL CO., LTD., Pyeongtaek-si, Gyeonggi-do (KR)

(72) Inventors: Won Seok Han, Anseong-si (KR); Won Yong Koh, Daejeon (KR)

(73) Assignee: UP CHEMICAL CO., LTD., Pyeongtaek-si, Gyeonggi-do (KR)

( * ) Notice: Subject to any disclaimer, the term of this patent is extended or adjusted under 35 U.S.C. 154(b) by 7 days.

(21) Appl. No.: 14/704,214

(22) Filed: May 5, 2015

(65) Prior Publication Data
US 2015/0235834 A1 Aug. 20, 2015

Related U.S. Application Data

(63) Continuation of application No. PCT/KR2013/010091, filed on Nov. 7, 2013.

(30) Foreign Application Priority Data

Nov. 7, 2012 (KR) .................. 10-2012-0125562
Mar. 28, 2013 (KR) .................. 10-2013-0033892

(Continued)

(51) Int. Cl.
*H01L 21/00* (2006.01)
*H01L 21/02* (2006.01)
(Continued)

(52) U.S. Cl.
CPC ........ *H01L 21/0217* (2013.01); *C23C 16/345* (2013.01); *C23C 16/45525* (2013.01);
(Continued)

(58) Field of Classification Search
CPC .................. H01L 21/0217; H01L 21/02211
See application file for complete search history.

(56) References Cited

U.S. PATENT DOCUMENTS 7,998,832 B2 * 8/2011 Carter ............... H01L 21/76232
257/510
8,143,131 B2 3/2012 Hsu et al.
(Continued)

FOREIGN PATENT DOCUMENTS

CN 101528974 A 9/2009
CN 101802984 A 8/2010
(Continued)

OTHER PUBLICATIONS

International Search Report of PCT/KR2013/010091 dated Feb. 24, 2014.
(Continued)

*Primary Examiner* — Richard A Booth
(74) *Attorney, Agent, or Firm* — Brundidge & Stanger, P.C.

(57) ABSTRACT

The present invention relates to a method for forming a silicon-containing thin film using a chlorosilane compound represented by $Si_nCl_{2n+2}$ (wherein, n is an integer of from about 3 to about 10), and a high-quality silicon nitride thin film can be formed to a uniform thickness on a surface including a protrusion or recess having a high aspect ratio by an atomic layer deposition method using an ammonia gas at a low temperature of particularly about 560° C. or less.

14 Claims, 3 Drawing Sheets

(30) Foreign Application Priority Data

Jun. 27, 2013 (KR) ........................ 10-2013-0074297
Nov. 7, 2013 (KR) ........................ 10-2013-0135071

(51) Int. Cl.
*C23C 16/34* (2006.01)
*C23C 16/455* (2006.01)

(52) U.S. Cl.
CPC .... *H01L 21/0228* (2013.01); *H01L 21/02164* (2013.01); *H01L 21/02167* (2013.01); *H01L 21/02211* (2013.01); *H01L 21/02271* (2013.01)

(56) References Cited

U.S. PATENT DOCUMENTS

| | | | |
|---|---|---|---|
| 2005/0136693 A1* | 6/2005 | Hasebe | C23C 16/345 438/791 |
| 2007/0048957 A1* | 3/2007 | Lee | H01L 21/28282 438/324 |
| 2007/0063255 A1* | 3/2007 | Ahn | H01L 29/42332 257/315 |
| 2007/0111545 A1 | 5/2007 | Lee et al. | |
| 2012/0085733 A1 | 4/2012 | Mebarki et al. | |

FOREIGN PATENT DOCUMENTS

| | | |
|---|---|---|
| JP | 201168092 A | 6/2001 |
| JP | 2002343793 A | 11/2002 |
| JP | 2002-367990 A | 12/2002 |
| JP | 2008244490 A | 10/2008 |
| JP | 2010219500 A | 9/2010 |
| JP | 2011524087 A | 8/2011 |
| JP | 2012-114223 A | 6/2012 |
| KR | 10-2005-0028321 A | 3/2005 |
| KR | 10-2009-0063170 A | 6/2009 |
| KR | 10-2009-0116433 A | 11/2009 |
| KR | 10-0944842 B1 | 3/2010 |
| KR | 1020100079149 A | 8/2010 |
| KR | 10-2011-0102686 A | 9/2011 |
| WO | 2010/025024 A1 | 3/2010 |
| WO | 2012147680 A | 11/2012 |

OTHER PUBLICATIONS

Yijian Chen et al., "Self-aligned triple patterning for continuous IC scaling to half-pitch 15nm", SPIE Proceedings, vol. 7973, Mar. 23, 2011.

Ivo J. Raaijmakers, "Current and Future Applications of ALD in Microelectronics",ECS Transactions, vol. 41, Issue 2, pp. 3-17, 2011.

V. G. Sevast'yanov et al., "Perchlorosilanes and perchlorocarbosilanes as precursors for SiC synthesis", Inorganic Materials, vol. 43, No. 4, pp. 369-372 Apr. 2007.

Ritala, Mikko, and Markku Leskela. "Atomic Layer Deposition." In Handbook of Thin Film Materials, edited by Hari Singh Nalwa. vol. 1, Deposition and Processing of Thin Films, 139-41. San Diego: Academic Press, 2002.

* cited by examiner

METHOD FOR MANUFACTURING SILICON-CONTAINING THIN FILM

TECHNICAL FIELD

The invention relates to a method for forming a silicon-containing thin film using a chlorosilane compound represented by $Si_nCl_{2n+2}$ (wherein, n is an integer of from about 3 to about 10).

BACKGROUND

A silicon nitride thin film has been used for various purposes in manufacturing a semiconductor device. In recent years, with continuously miniaturizing semiconductor devices, a silicon nitride thin film of 30 nm or less, or even 10 nm or less has been needed. By way of example, Korean Patent Laid-open Publication No. 10-2011-0102686 (International Patent Application Publication No. WO2010/025024) discloses that a dielectric material such as silicon nitride is preferable as a liner material of an isolation trench and that a thickness thereof is from 20 Å to 100 Å, i.e., 2 nm to 10 nm. Further, U.S. Patent Laid-open Publication No. 2012/0085733 discloses that when an uneven surface is covered with a spacer layer having a uniform thickness in order to increase a pattern density after a lithography process, silicon nitride can be used as a material of the spacer layer. In order to form a pattern having a half-pitch of 15 nm for manufacturing a semiconductor device, a nitride spacer needs to be formed to have a thickness of about 15 nm on the uneven surface [Chen Y, Xu P, Miao L, et al.; "Self-aligned triple patterning for continuous is scaling to half-pitch 15 nm" SPIE Advanced Lithography. 0001; 79731P-8. doi: 10.1117/12.881645].

U.S. Pat. No. 8,143,131 discloses a method in which a silicon oxide spacer is formed on a gate stack of a transistor and then a silicon nitride spacer is formed to have a thickness of 20 Å to 200 Å, i.e., 2 nm to 20 nm, on the silicon oxide spacer. The atomic layer deposition method in which gaseous materials for forming films are alternately brought into contact with a substrate surface is particularly advantageous in forming a film having a uniform thickness on a surface including a trench having a small width and a high aspect ratio. A thickness of the spacer formed on the gate stack needs to be precisely controlled. Instead of the conventional low pressure chemical vapor deposition method, the atomic layer deposition method for forming a silicon nitride thin film at a low temperature has been actively studied [Raaijmakers I; "Current and Future Applications of ALD in Micro-electronics" ECS Transactions, Volume 41, Issue 2, pp 3-17 (2011). doi: 10.1149/1.3633649].

However, in spite of such a need, there has not been known a method for forming a silicon nitride thin film having excellent properties to a uniform thickness on a surface including a trench having a small width and a high aspect ratio by the atomic layer deposition (ALD) method at a temperature of 560° C. or less, 520° C. or less, 500° C. or less, or 450° C. or less.

DETAILED DESCRIPTION OF THE INVENTION

Problems to be Solved by the Invention

In view of the foregoing problems, one purpose of the present disclosure is to provide a method for forming a silicon-containing thin film to a uniform thickness on a surface of a substrate including a protrusion or recess such as a fine trench.

Another purpose of the present disclosure is also to provide a method for forming a silicon oxide thin film, a silicon nitride thin film, or a silicon carbonitride thin film to a uniform thickness of about 100 nm or less on a surface of a substrate including a protrusion or recess.

Yet another purpose of the present disclosure is to provide a method for forming a silicon oxide thin film, a silicon nitride thin film, or a silicon carbonitride thin film to a uniform thickness on a surface of a substrate including a protrusion or recess at a temperature of about 800° C. or less.

Still another purpose of the present disclosure is to provide a method for forming a silicon oxide thin film, a silicon nitride thin film, or a silicon carbonitride thin film to a uniform thickness on a surface of a substrate including a protrusion or recess at a low temperature of about 560° C. or less, about 520° C. or less, about 500° C. or less, or about 450° C. or less.

However, problems to be solved by the example embodiments of the present disclosure are not limited to the above-described problems. Although not described herein, other problems to be solved by the present disclosure can be clearly understood by those skilled in the art from the following descriptions.

Means for Solving the Problems

In a first aspect of the present disclosure, there is provided a method for forming a silicon-containing thin film, including: bringing a gas including a chlorosilane compound represented by the chemical formula of $Si_nCl_{2n+2}$ (wherein, n is an integer of from about 3 to about 10) and a reactant gas including an element selected from the group consisting of nitrogen, oxygen, carbon, and their combinations into contact with a substrate including at least one trench having an aspect ratio of about 1 or more and a width of about 1 μm or less.

Effect of the Invention

In accordance with the present disclosure, it is possible to form various silicon-containing thin films each having a uniform thickness on a surface of a substrate including a protrusion or recess such a fine trench.

In accordance with an example embodiment of the present disclosure, it is possible to form a silicon oxide thin film, a silicon nitride thin film, or a silicon carbonitride thin film with a uniform thickness of about 100 nm or less on a surface of a substrate including a protrusion or recess.

In accordance with an example embodiment of the present disclosure, it is possible to form various silicon-containing thin films such as a silicon oxide thin film, a silicon nitride thin film, or a silicon carbonitride thin film with a uniform thickness on a surface of a substrate including a protrusion or recess at a temperature of about 800° C. or less.

In accordance with an example embodiment of the present disclosure, there is provided a method for forming various silicon-containing thin films such as a silicon oxide thin film, a silicon nitride thin film, or a silicon carbonitride thin film with a uniform thickness on a surface of a substrate including a protrusion or recess at a low temperature of about 560° C. or less, about 520° C. or less, about 500° C. or less, or about 450° C. or less.

In accordance with an example embodiment of the present disclosure, it is possible to form various silicon-containing thin films such as a silicon oxide thin film, a silicon nitride thin film, or a silicon carbonitride thin film with a uniform thickness of about 100 nm or less by the chemical vapor deposition (CVD) method or atomic layer deposition (ALD) method.

In accordance with an example embodiment of the present disclosure, it is possible to form various silicon-containing thin films such as a silicon oxide thin film, a silicon nitride thin film, or a silicon carbonitride thin film with a uniform thickness of about 100 nm or less by the ALD method.

The various silicon-containing thin films formed in accordance with the present disclosure may be used as a gate spacer, an isolation trench liner, a spacer for increasing a pattern density after a lithography process, etc.

BEST MODE FOR CARRYING OUT THE INVENTION

Figure 1A:
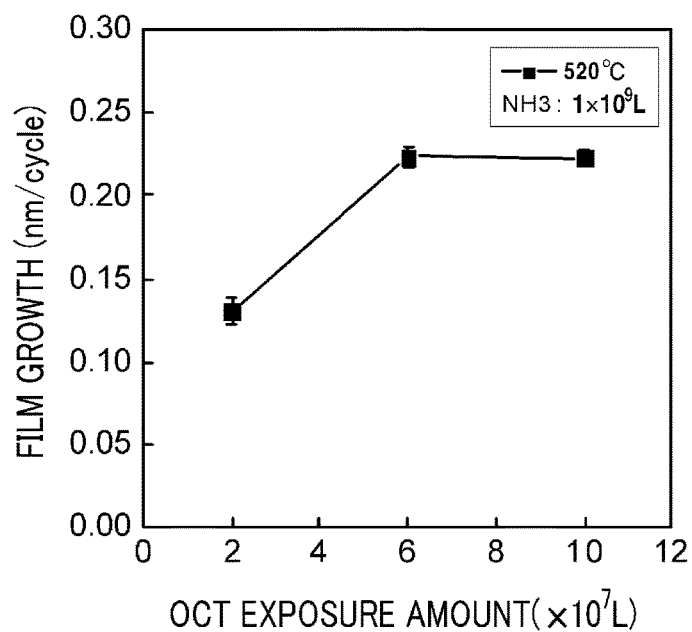
FIG. 1A and FIG. 1B are graphs each showing film growth according to an atomic layer deposition method in which a silicon substrate is maintained at 520° C. and an exposure amount of the octachlorotrisilane (OCT) gas and an exposure amount of the ammonia gas independently varies within one cycle of the atomic layer deposition.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document of the present disclosure.

Through the whole document of the present disclosure, the term "connected to" or "coupled to" that is used to designate a connection or coupling of one element to another element includes both a case that an element is "directly connected or coupled to" another element and a case that an element is "electronically connected or coupled to" another element via still another element.

Through the whole document of the present disclosure, the term "on" that is used to designate a position of one element with respect to another element includes both a case that the one element is adjacent to the another element and a case that any other element exists between these two elements.

Through the whole document of the present disclosure, the term "comprises or includes" and/or "comprising or including" used in the document means that one or more other components, steps, operation and/or existence or addition of elements are not excluded in addition to the described components, steps, operation and/or elements unless context dictates otherwise. The term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document of the present disclosure, the term "combinations of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "silicon-containing thin film" refers to a thin film formed by containing silicon and at least one element selected from the group consisting of oxygen, nitrogen, and carbon, and may further contain metal elements typically used in the semiconductor field for forming composite thin films of silicon and other metal elements in addition to the silicon as necessary. By way of example, the silicon-containing thin film may include a silicon oxide thin film, a silicon nitride thin film, or a silicon carbonitride thin film, but may not be limited thereto.

Through the whole document, the term "reactant gas", "additional reactant gas", or "second reactant gas" refers to a reactant gas used in addition to a chlorosilane compound-containing reactant gas and may be a gas including, for example, but not limited to, an element selected from the group consisting of nitrogen, oxygen, carbon, and their combinations.

Hereinafter, a method for forming a silicon-containing thin film of the present disclosure will be explained in detail with reference to examples and drawings. However, the present disclosure is not limited to the following embodiments, examples, and drawings.

In a first aspect of the present disclosure, there is provided a method for forming a silicon-containing thin film, including: bringing a gas including a chlorosilane compound represented by the chemical formula of $Si_nCl_{2n+2}$ (wherein, n is an integer of from about 3 to about 10) and a reactant gas including an element selected from the group consisting of nitrogen, oxygen, carbon, and their combinations into contact with a substrate including at least one trench having an aspect ratio of about 1 or more and a width of about 1 μm or less.

The aspect ratio may be, for example, about 1 or more, about 5 or more, about 10 or more, about 15 or more, or about 20 or more, and the width may be, for example, about 1 μm or less, about 0.5 μm or less, or about 0.1 μm or less, but may not be limited thereto.

In accordance with an example embodiment of the present disclosure, the thin film may be formed by, but not limited to, a chemical vapor deposition (CVD) method or an atomic layer deposition (ALD) method.

In accordance with an example embodiment of the present disclosure, a thickness of the silicon-containing thin film may be about 100 nm or less, but may not be limited thereto.

In accordance with an example embodiment of the present disclosure, a thickness of the silicon-containing thin film may be about 30 nm or less, but may not be limited thereto.

In accordance with an example embodiment of the present disclosure, the substrate may be maintained at a temperature of from room temperature to about 800° C. or less, but may not be limited thereto.

In accordance with an example embodiment of the present disclosure, the substrate may be maintained at a temperature of from room temperature to about 560° C. or less, but may not be limited thereto.

In accordance with an example embodiment of the present disclosure, the substrate may be maintained at a temperature of from room temperature to about 520° C. or less, but may not be limited thereto.

In accordance with an example embodiment of the present disclosure, the substrate may be maintained at a temperature of from about 190° C. to about 560° C., but may not be limited thereto.

In accordance with an example embodiment of the present disclosure, the substrate may be maintained at a temperature of from about 280° C. to about 520° C., but may not be limited thereto.

In accordance with an example embodiment of the present disclosure, the substrate may be maintained at a temperature of from about 300° C. to about 450° C., but may not be limited thereto.

In accordance with an example embodiment of the present disclosure, the reactant gas including an element selected from the group consisting of nitrogen, oxygen, carbon, and their combinations may not be specifically limited as long as it can react with the chlorosilane compound. By way of example, the reactant gas containing nitrogen may include an ammonia ($NH_3$)-containing gas or an alkylamine-containing gas, but may not be limited thereto. In the alkylamine-containing gas, the alkylamine may include an amine including an alkyl group having about 1 to about 10 carbon atoms, an amine including an alkyl group having about 1 to about 8 carbon atoms, an amine including an alkyl group having about 1 to about 6 carbon atoms, or an amine including an alkyl group having about 1 to about 4 carbon atoms, and the alkyl group may be a linear or branched alkyl group, but may not be limited thereto. By way of example, the alkylamine may include a gas selected from the group consisting of methylamine, ethylamine, isopropylamine, t-butylamine, and isomers thereof, but may not be limited thereto.

By way of example, the reactant gas containing oxygen may include a member selected from the group consisting of an oxygen ($O_2$)-containing gas, an ozone ($O_3$)-containing gas, a water ($H_2O$) vapor-containing gas, and their combinations, but may not be limited thereto.

By way of example, the reactant gas containing carbon may include an alkylamine-containing gas, but may not be limited thereto. In the alkylamine-containing gas, the alkylamine may include an amine including an alkyl group having about 1 to about 10 carbon atoms, an amine including an alkyl group having about 1 to about 8 carbon atoms, an amine including an alkyl group having about 1 to about 6 carbon atoms, or an amine including an alkyl group having about 1 to about 4 carbon atoms, and the alkyl group may be a linear or branched alkyl group, but may not be limited thereto. By way of example, the alkylamine may include a gas selected from the group consisting of methylamine, ethylamine, isopropylamine, t-butylamine, and isomers thereof, but may not be limited thereto.

In accordance with an example embodiment of the present disclosure, the method for forming a silicon-containing thin film may include alternately bringing the gas containing the chlorosilane compound and the reactant gas including an element selected from the group consisting of nitrogen, oxygen, carbon, and their combinations into contact with the substrate, but may not be limited thereto.

In accordance with an example embodiment of the present disclosure, the chlorosilane compound may include a member selected from the group consisting of $Si_3Cl_8$, $Si_4Cl_{10}$, and $Si_5Cl_{12}$, but may not be limited thereto.

In accordance with an example embodiment of the present disclosure, the silicon-containing thin film may include a silicon oxide thin film, a silicon nitride thin film, or a silicon carbonitride thin film, but may not be limited thereto.

In accordance with an example embodiment of the present disclosure, the reactant gas may include ammonia, but may not be limited thereto. If a gas containing the ammonia is used as the reactant gas, a silicon nitride thin film may be formed. If a gas containing the alkylamine is used as the reactant gas, a silicon carbonitride thin film may be formed.

In accordance with an example embodiment of the present disclosure, the chlorosilane compound represented by the chemical formula of $Si_nCl_{2n+2}$ (wherein, n is an integer of from about 3 to about 10) may include a linear or branched isomer thereof, but may not be limited thereto.

In accordance with an example embodiment of the present disclosure, various silicon-containing thin films such as a silicon oxide thin film, a silicon nitride thin film, or a silicon carbonitride thin film may be formed as a uniform thickness using the chlorosilane compound including a member selected from the group consisting of $Si_3Cl_8$, $Si_4Cl_{10}$, and $Si_5Cl_{12}$ as a precursor by the CVD method or the ALD method, but may not be limited thereto.

In an example embodiment of the present disclosure, a thickness of the silicon-containing thin film may be about 100 nm or less, about 80 nm or less, about 50 nm or less, about 30 nm or less, about 10 nm or less, about 5 nm or less, or about 1 nm or less, but may not be limited thereto. In an example embodiment of the present disclosure, the thickness of the silicon nitride thin film may be about 100 nm or less, about 80 nm or less, about 50 nm or less, about 30 nm or less, about 10 nm or less, about 5 nm or less, or about 1 nm or less, but may not be limited thereto.

In accordance with an example embodiment of the present disclosure, there is provided a method for forming a silicon nitride thin film, including: bringing a gas containing the chlorosilane compound represented by the chemical formula of $Si_nCl_{2n+2}$ (wherein, n is an integer of from about 3 to about 10) and a gas containing ammonia into contact with a substrate. The silicon nitride thin film may be formed by a chemical vapor deposition method in which the gas containing the chlorosilane compound and the gas containing ammonia are brought into contact with the substrate at the same time or by an atomic layer deposition method in which the gas containing the chlorosilane compound and the gas containing ammonia are alternately brought into contact with the substrate, but may not be limited thereto. By way of example, the chlorosilane compound may include a member selected from the group consisting of $Si_3Cl_8$, $Si_4Cl_{10}$, and $Si_5Cl_{12}$, but may not be limited thereto.

In accordance with an example embodiment of the present disclosure, there is provided a method for forming a silicon oxide thin film, including: bringing a gas containing the chlorosilane compound represented by the chemical formula of $Si_nCl_{2n+2}$ (wherein, n is an integer of from about 3 to about 10) and a gas containing oxygen into contact with a substrate. The silicon oxide thin film may be formed by a chemical vapor deposition method in which the gas containing the chlorosilane compound and the gas containing oxygen are brought into contact with the substrate at the same time or by an atomic layer deposition method in which the gas containing the chlorosilane compound and the gas containing oxygen are alternately brought into contact with the substrate, but may not be limited thereto. By way of example, the chlorosilane compound may include a member selected from the group consisting of $Si_3Cl_8$, $Si_4Cl_{10}$, and $Si_5Cl_{12}$, but may not be limited thereto.

In accordance with an example embodiment of the present disclosure, there is provided a method for forming a silicon carbonitride thin film, including: bringing a gas containing the chlorosilane compound represented by the chemical formula of $Si_nCl_{2n+2}$ (wherein, n is an integer of from about 3 to about 10) into contact with a substrate and a gas containing nitrogen and carbon. As the gas containing nitrogen and carbon, a gas containing an alkylamine may be used. The silicon carbonitride thin film may be formed by a chemical vapor deposition method or an atomic layer deposition method, but may not be limited thereto. By way of example, the chlorosilane compound may include a member selected from the group consisting of $Si_3Cl_3$, $Si_4Cl_{10}$, and $Si_3Cl_{12}$, but may not be limited thereto.

If it is necessary to form a film having a uniform thickness on a surface of a substrate including a protrusion or recess, particularly a trench having a small width and a high aspect ratio, the atomic layer deposition method is more desirable. When the atomic layer deposition method is used, there may be used a conventional time-division atomic layer deposition apparatus configured to supply each source gas in sequence. Further, there may be used a space-division atomic layer deposition apparatus configured to allow a substrate to repeatedly move in and out of a first space filled with a gas containing the chlorosilane compound and a second space filled with an additional reactant gas in sequence.

In manufacturing a semiconductor device, for example, when a silicon nitride thin film is formed, a gas containing ammonia ($NH_3$) as a nitrogen source may be mainly used as the additional reactant gas. Nitrogen gas ($N_2$) cannot be used since it has a too low reactivity, and hydrazine ($N_2H_4$) is not suitable to be used in a semiconductor process since it has the risk of explosion. Ammonia gas has a high reactivity at a high temperature but has a low reactivity at a temperature of about 550° C. or less, and thus, it is difficult to form a silicon nitride thin film having excellent properties using ammonia gas as a nitrogen source at a temperature of about 550° C. or less. In a case that a nitrogen source, such as hydrazine, having a higher reactivity than ammonia gas cannot be used in a semiconductor process due to the risk of explosion, a new method capable of forming a silicon nitride thin film having excellent properties using ammonia is needed. If ammonia has a low reactivity at a low temperature of about 550° C. or less, it is possible to form a silicon nitride thin film having excellent properties using a silicon source having a higher reactivity at this temperature range.

When the chlorosilane compound represented by the chemical formula of $Si_nCl_{2n+2}$ (wherein, n is an integer of from about 3 to about 10) is pyrolyzed, $SiCl_2$ or $SiCl$ gas having a high reactivity may be generated. It has been theoretically suggested that when a $Si_3Cl_8$ gas is used as a source, SiC can be formed at a much lower temperature, as compared with a case where $SiCl_4$ gas is used [V. G. Sevast'yanov, Yu. S. Ezhov, R. G. Pavelko, and N. T. Kuznetsov, "Perchlorosilanes and Perchlorocarbosilanes as Precursors for SiC Synthesis", Inorganic Materials, 2007, Vol. 43, No. 4, pp. 369-372]. In this article, it was predicted by a computational chemical method that $Si_3Cl_8$ gas is pyrolyzed at a low temperature at which $SiCl_4$ gas is not pyrolyzed so that $SiCl_2$ gas and $SiCl_3$ gas are generated, which suggests that SiC can be generated at a low temperature. Since silicon atom having four bonds has the highest stability, $SiCl_3$ is more reactive than $SiCl_4$, $SiCl_2$ is more reactive than $SiCl_3$, SiCl is more reactive than $SiCl_2$, and Si is more reactive than SiCl. Upon anticipating that a Si—Si bond is broken on a surface of a substrate or in a gas state at a high temperature, when n is about 3 or more, about 4 or more, or about 5 or more in the chlrorosilane compound represented by $Si_nCl_{2n+2}$, it can be anticipated that highly reactive $SiCl_2$, SiCl, and Si are generated, as shown by the following scheme:

[Scheme]

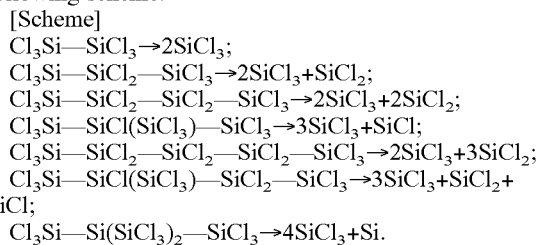

In accordance with an example embodiment of the present disclosure, the substrate may be maintained at a temperature of from room temperature to about 800° C. or less, but may not be limited thereto. By way of example, if a gas containing the chlorosilane compound represented by $Si_nCl_{2n+2}$ (wherein, n is about 3, or an integer of from about 3 to about 10) is used, a temperature of the substrate may not be specially limited.

In accordance with the present disclosure, it is possible to form a high-quality silicon-containing thin film using the chlorosilane compound represented by the chemical formula $Si_nCl_{2n+2}$ (wherein, n is about 3, or an integer of from about 3 to about 10) at a low temperature of about 560° C. or less, about 520° C. or less, about 450° C. or less, or less than about 450° C.

In accordance with an example embodiment of the present disclosure, the substrate may be maintained at a temperature of from room temperature to about 560° C. or less, or from room temperature to about 520° C. or less, or from about 190° C. or more to about 560° C. or less, or from about 280° C. or more to about 520° C. or less, or from about 300° C. to about 450° C. or less, but may not be limited thereto.

In an example embodiment of the present disclosure, the substrate may be maintained at a temperature of from room temperature to about 560° C. or less, or from room temperature to about 520° C. or less, or from about 190° C. to about 560° C. or less, or about 450° C. or less or less than about 450° C., or from about 300° C. or more to about 450° C. or less or less than about 450° C., for example, from about 150° C. to about 520° C., from about 280° C. to about 520° C., from about 300° C. to about 520° C., from about 320° C. to about 520° C., from about 350° C. to about 520° C., from about 370° C. to about 520° C., from about 400° C. to about 520° C., from about 420° C. to about 520° C., from about 150° C. to about 450° C., from about 170° C. to about 450° C., from about 200° C. to about 450° C., from about 220° C. to about 450° C., from about 250° C. to about 450° C., from about 270° C. to about 450° C., from about 300° C. to about 450° C., from about 320° C. to about 450° C., from about 350° C. to about 450° C., from about 370° C. to about 450° C., from about 400° C. to about 450° C., from about 150° C. to about 440° C., from about 170° C. to about 440° C., from about 200° C. to about 440° C., from about 220° C. to about 440° C., from about 250° C. to about 440° C., from about 270° C. to about 440° C., from about 300° C. to about 440° C., from about 320° C. to about 440° C., from about 350° C. to about 440° C., from about 370° C. to about 440° C., or from about 400° C. to about 440° C., but may not be limited thereto.

In an example embodiment of the present disclosure, the chlorosilane compound may include a member selected from the group consisting of $Si_3Cl_8$, $Si_4Cl_{10}$, and $Si_5Cl_{12}$, but may not be limited thereto. A chlorosilane compound having a too large molecular weight cannot be applied to a chemical vapor deposition method or an atomic layer deposition method due to a low vapor pressure thereof. Therefore, the chlorosilane compound in accordance with the present disclosure may include chlorosilane compounds represented by the chemical formula of $Si_nCl_{2n+2}$ where n is an integer of about 10 or less among the chlorosilane compounds represented by the chemical formula $Si_nCl_{2n+2}$ where n is about 3 or more. By way of example, the chlorosilane compound may be a chlorosilane compound in which the above n is an integer of about 3 to about 5, but may not be limited thereto.

MODE FOR CARRYING OUT THE INVENTION

Hereinafter, the present disclosure will be explained in detail with reference to examples. However, the present disclosure is not limited thereto.

EXAMPLE

Example 1 Formation of Silicon Nitride Thin Film by Atomic Layer Deposition Using OCT ($Si_3Cl_8$) Gas and Ammonia Gas Octachlorotrisilane (OCT, $Si_3Cl_8$) was put into a container heated to 65° C., and the OCT gas vaporized from the container and ammonia gas were alternately brought into contact with a silicon substrate placed in an atomic layer deposition chamber. When the OCT gas heated to 65° C. was supplied without a separate carrier gas, an internal pressure of the chamber was maintained at 0.5 Torr, and when only the ammonia gas was supplied, an internal pressure of the chamber was maintained at 9.5 Torr. The silicon substrate was constantly maintained at a temperature in a range of from 150° C. to 600° C. An atomic layer deposition cycle including OCT gas supply→evacuation→Ar gas supply for 40 seconds→evacuation→ammonia gas supply→evacuation→Ar gas supply for 40 seconds→evacuation was repeated 40 times, to form a silicon nitride thin film. A thickness and a characteristic of the silicon nitride thin film were analyzed. If a carrier gas is used in the atomic layer deposition cycle, a mixed gas of the OCT gas and the carrier gas may be used instead of the OCT gas. For another reason, a mixed gas of the OCT gas and an inert gas may be used. A mixed gas of ammonia gas and an inert gas may be used instead of the ammonia gas.

Figure 1B:
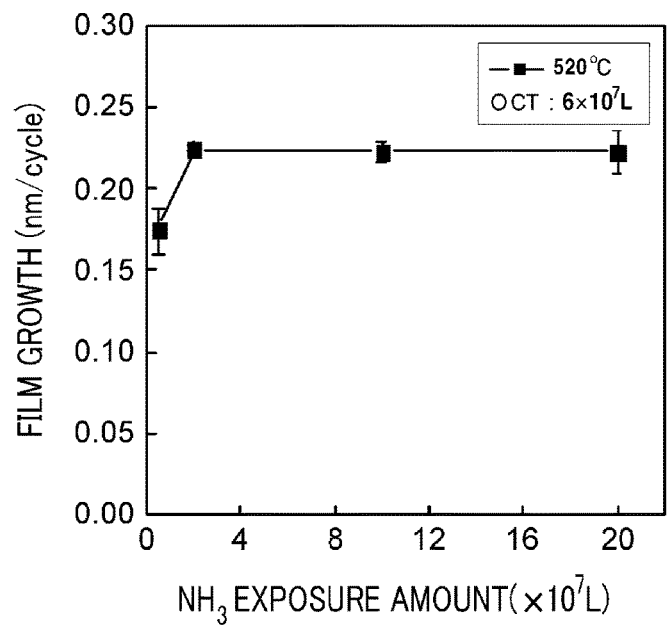

FIG. 1A and FIG. 1B are graphs each showing film growth according to an atomic layer deposition method in which a silicon substrate is maintained at 520° C. in accordance with the present example and an exposure amount of octachlorotrisilane (OCT) gas and an exposure amount of ammonia gas independently varies in one cycle of an atomic layer deposition. Herein, an exposure amount unit L corresponds to 1 langmuir (=1×10$^{-6}$ Torr×1 second). Therefore, an OCT exposure amount of 6×10$^7$ L means that the substrate is exposed to the OCT gas under a pressure of 0.5 Torr for 120 seconds. Further, an ammonia exposure amount of 2×10$^8$ L means that the substrate is exposed to the ammonia gas under a pressure of 9.5 Torr for 22 seconds. It can be seen that even if the OCT exposure amount is increased to be 6×10$^7$ L or more or the ammonia exposure amount is increased to be 2×10$^8$ L or more when the substrate has a temperature of 520° C., film growth does not increase, and, thus, an atomic layer deposition is possible at 520° C.

Figure 2:
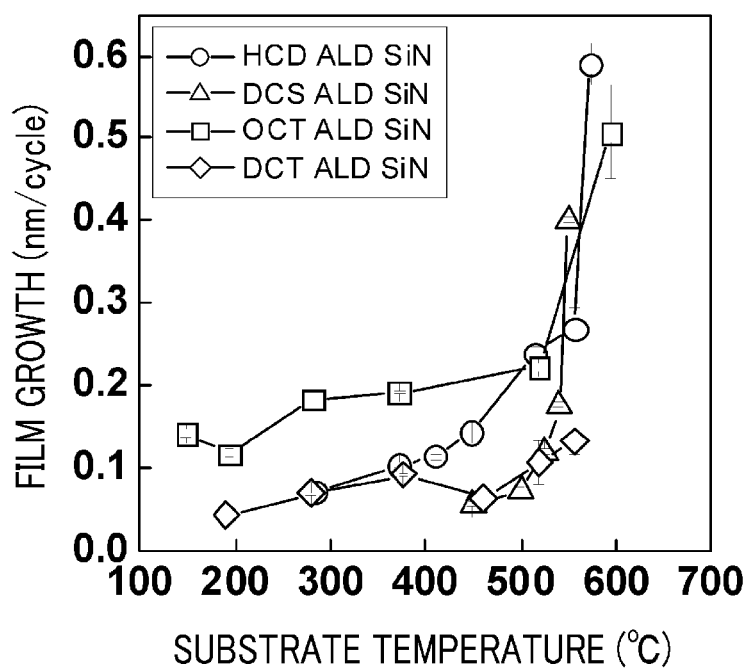
FIG. 2 is a graph showing film growth of silicon nitride thin films respectively formed at various temperatures of a substrate using various chlorosilane gases in accordance with Example 1, and Example 2 of the present disclosure, and Comparative Example 1.

An atomic layer deposition experiment was carried out using OCT gas supplied for 120 seconds and ammonia gas supplied for 110 seconds at various temperatures of the substrate. Film growth depending on a temperature of the substrate was as shown in FIG. 2. FIG. 2 is a graph showing film growth of silicon nitride thin films respectively formed at various temperatures of the substrate in accordance with the present example. In a substrate temperature range of from 282° C. to 520° C., a film having a uniform thickness could be obtained from each atomic layer deposition cycle regardless of exposure amounts of the OCT gas and the ammonia gas.

A silicon nitride thin film was formed by repeating the atomic layer deposition cycle 20 times using the OCT and ammonia gases at 520° C. on a silicon wafer surface including a trench having a width of 40 nm, and a depth of 2 μm with an aspect ratio of 50:1 under the above-described condition, and the silicon nitride thin film was observed with a transmission electron microscope (TEM). It was confirmed that the silicon nitride thin film was measured to have a thickness of 4.62 nm at the inlet of the trench and 4.36 nm at the bottom of the trench so that a step coverage was 94% (=4.36/4.62) which is very close to a desired value of 100%.

Figure 3A:
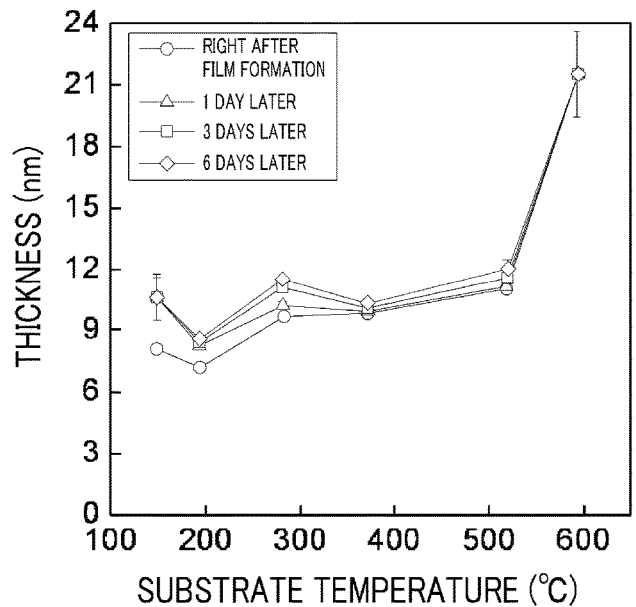
FIG. 3A and FIG. 3B are graphs showing results of thicknesses and refractive indexes of silicon nitride thin films respectively formed at various temperatures of a substrate in accordance with Example 1 of the present disclosure, the thickness and refractive indexes were measured at right after the film formation, 1 day, 3 days and 6 days after the film formation.
Figure 3B:
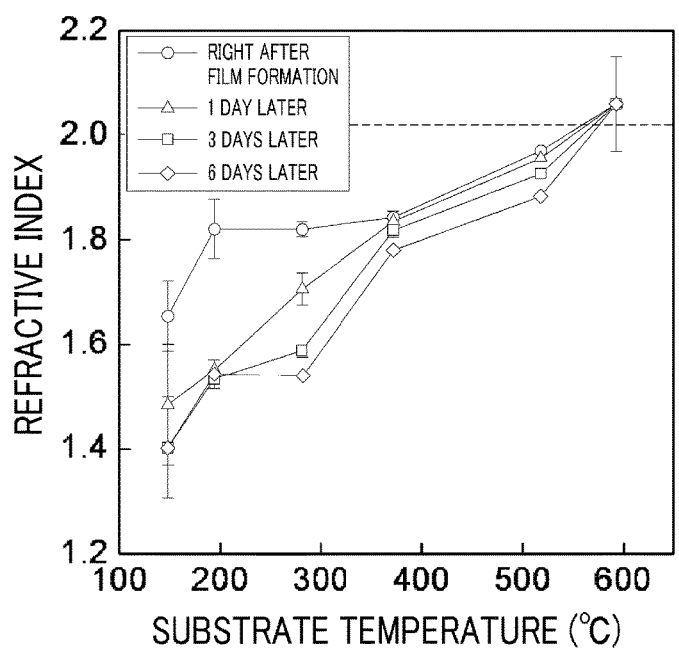

Thicknesses and refractive indexes of silicon nitride thin films respectively formed at various temperatures of a substrate using OCT and ammonia gases were measured right after the film formation, 1 day, 3 days and 6 days after the film formation and shown in FIG. 3A and FIG. 3B. FIG. 3A and FIG. 3B are graphs showing results of the measurement conducted right after film formation, 1 day later, 3 days later, and 6 days later after the film formation on thicknesses and refractive indexes of silicon nitride thin films respectively formed at various temperatures of a substrate in accordance with the present example of the present disclosure. A thickness of the silicon nitride thin film formed at 282° C. or less was increased as time passed, but a thickness of the silicon nitride thin film formed at 372° C. or more was rarely changed as time passed. The silicon nitride thin film formed at a high temperature of the substrate had a refractive index closer to a refractive index 2.0 of silicon nitride. A refractive index of the silicon nitride thin film formed at 282° C. or less was decreased as time passed. A composition of the silicon nitride thin film formed at 282° C. or less was not close to a stable composition of $Si_3N_4$, and, thus, the silicon nitride thin film reacted with moisture or oxygen ($O_2$) gas in air to be converted into silicon oxynitride. Therefore, it can be construed that the refractive index is changed to be close to a refractive index 1.45 of silicon oxide ($SiO_2$).

From this result, it can be seen that the substrate temperature in a range of from 300° C. to 520° C. is desirable in forming a silicon nitride thin film having a stable composition using OCT as a silicon source.

Example 2 Formation of Silicon Nitride Thin Film by Atomic Layer Deposition Using DCT ($Si_4Cl_{10}$) Gas and Ammonia Gas Dodecachlorotetrasilane (DCT, $Si_4Cl_{10}$) was put into a container heated to 80° C., and a DCT gas vaporized from the container and ammonia gas were alternately brought into contact with a silicon substrate placed in an atomic layer deposition chamber. When the DCT gas heated to 80° C. was supplied without a separate carrier gas, an internal pressure of the chamber was maintained at 0.1 Torr, and when only ammonia gas was supplied, an internal pressure of the chamber was maintained at 9.5 Torr. The silicon substrate was constantly maintained at a temperature in a range of from 190° C. to 560° C. An atomic layer deposition cycle including a DCT gas supply for 100 seconds→evacuation→Ar gas supply for 40 seconds→evacuation→ammonia gas supply for 110 seconds→evacuation→Ar gas supply for 40 seconds→evacuation was repeated 40 times, to form a silicon nitride thin film. A thickness of the silicon nitride thin film was analyzed. If a carrier gas is used in the atomic layer deposition cycle, a mixed gas of the DCT gas and the carrier gas may be used instead of the DCT gas. For another reason, a mixed gas of the DCT gas and an inert gas may be used. A mixed gas of ammonia gas and an inert gas may be used instead of the ammonia gas.

An atomic layer deposition experiment was carried out using DCT gas and ammonia gas at various temperatures of the substrate. Film growth depending on a temperature of the substrate was as shown in FIG. 2. FIG. 2 shows film growth of silicon nitride thin films respectively formed at various temperatures of the substrate in accordance with the present example. In the substrate temperature range of from 190° C. to 560° C., a film having a uniform thickness was obtained from each atomic layer deposition cycle regardless of exposure amounts of the DCT gas and the ammonia gas.

Comparative Example 1 Formation of Silicon Nitride Thin Film by Atomic Layer Deposition Using Hexachlorodisilane (HCD, $Si_2Cl_6$) Gas or Dichlorosilane (DCS, $SiH_2Cl_2$) Gas and Ammonia Gas A silicon nitride thin film was formed under the same condition as in Example 1 except that HCD or DCS was used instead of OCT. An atomic layer deposition experiment was carried out at various temperatures of the substrate. Film growth depending on a temperature of the substrate was as shown in FIG. 2. Unlike Example 1 and Example 2 in which a film having a uniform thickness was obtained from each atomic layer deposition cycle regardless of exposure amounts of the OCT or DCT gas and the ammonia gas, there was no temperature range in which a film having a uniform thickness could be obtained from each atomic layer deposition cycle using the HCD or DCS gas. This means that an ALD process cannot be performed using the HCD or DCS gas and the ammonia gas. If the ALD process cannot be performed, a silicon nitride thin film having a uniform thickness cannot be formed on a pattern having a high aspect ratio of a substrate surface including a trench having a small width and a high aspect ratio.

From Example 1, Example 2, and Comparative Example 1, it can be seen that in order to achieve the purpose of forming a silicon nitride thin film with a uniform thickness on a substrate including a protrusion or recess, particularly a substrate including a trench having a small width and a high aspect ratio, at a temperature of 560° C. or less, the atomic layer deposition method using the chlorosilane compound-containing gas and the ammonia gas in accordance with the present disclosure is much more desirable as compared with the atomic layer deposition method using the HCD or DCS gas and ammonia gas.

A silicon nitride thin film can be formed to a thickness of about 8 nm at a temperature of from room temperature to about 560° C. or from about 300° C. to about 560° C. by an atomic layer deposition method. Therefore, it is possible to form a silicon nitride thin film with a uniform thickness of 100 nm or less, 30 nm or less, or 10 nm or less on a substrate including a protrusion or recess such as at least one trench having an aspect ratio of 1 or more and a width of 1 μm or less.

Example 3 Formation of Silicon Oxide Thin Film by Atomic Layer Deposition Using $Si_4Cl_{10}$ Gas $Si_4Cl_{10}$ was stored in a container. The container was hated at 90° C., and $N_2$ was used as a carrier gas at a flow late of 50 sccm. A pressure of the container was controlled at 50 Torr. $O_3$ was used as an oxygen supply source. A silicon substrate was heated at 350° C. During a first step, $Si_4Cl_{10}$ was introduced into a reaction chamber for 2 seconds. Then, as a second step, $N_2$ purging was carried out for 5 seconds. Then, as a third step, $O_3$ purging was applied to the reaction chamber for 2 seconds, and as a fourth step, $N_2$ purging was carried out for 2 seconds. $SiO_2$ thin film was obtained by an atomic layer deposition method of repeating the above four steps 100 times.

Example 4 Formation of Silicon Oxide Thin Film by Chemical Vapor Deposition Using $Si_4Cl_{10}$ Gas $Si_4Cl_{10}$ was stored in a container. The container was hated at 90° C., and $N_2$ was used as a carrier gas at a flow late of 50 sccm. A pressure of the container was controlled at 50 Torr. $Si_4Cl_{10}$ was mixed with a mixture of $O_2/N_2$ gases in a reaction chamber. A silicon substrate was heated at 500° C. An internal pressure of the reaction chamber was set to 100 Torr. $SiO_2$ thin film was obtained by such a process.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method to form a silicon-containing thin film, comprising:
   supplying a gas including a chlorosilane compound represented by the chemical formula of $Si_nCl_{2n+2}$ (wherein n is an integer of from 4 to 10) and a reactant gas including an element selected from the group consisting of nitrogen, oxygen, carbon, and their combinations to a substrate including at least one fine trench having an aspect ratio of 1 or more and a width of 1 μm or less to form the silicon-containing thin film having a uniform film thickness on a surface of the substrate including a surface of the fine trench, and wherein the silicon-containing thin film is formed by an atomic layer deposition (ALD) method, and wherein a thickness of the silicon-containing thin film is about 80 nm or less, and wherein a temperature of the substrate is in a range of temperature at which the ALD using the gas including the chlorosilane compound is carried out.

2. The method to form a silicon-containing thin film of claim 1, wherein the thickness of the silicon-containing thin film is about 30 nm or less.

3. The method to form a silicon-containing thin film of claim 1, wherein the substrate is maintained at a temperature of from an ambient temperature to about 800° C.

4. The method to form a silicon-containing thin film of claim 1, wherein the substrate is maintained at a temperature of from an ambient temperature to about 560° C.

5. The method to form a silicon-containing thin film of claim 1, wherein the substrate is maintained at a temperature of from about 280° C. to about 520° C.

6. The method to form a silicon-containing thin film of claim 1, wherein the substrate is maintained at a temperature of from about 300° C. to about 450° C.

7. The method to form a silicon-containing thin film of claim 1, wherein the reactant gas includes a member selected from the group consisting of an ammonia ($NH_3$)-containing gas, an alkylamine-containing gas, an oxygen ($O_2$)-containing gas, an ozone ($O_3$)-containing gas, a water ($H_2O$) vapor-containing gas, and their combinations.

8. The method to form a silicon-containing thin film of claim 1, wherein the gas including chlorosilane compound and the reactant gas are alternately supplied to the substrate.

9. The method to form a silicon-containing thin film of claim 1, wherein the silicon-containing thin film includes a silicon oxide thin film, a silicon nitride thin film, or a silicon carbonitride thin film.

10. The method to form a silicon-containing thin film of claim 1, wherein the chlorosilane compound includes a member selected from the group consisting of $Si_4Cl_{10}$, and $Si_5Cl_{12}$.

11. The method to form a silicon-containing thin film of claim 10, wherein the reactant gas includes ammonia, and the silicon-containing thin film includes a silicon nitride thin film.

12. A method to form a silicon-containing thin film, comprising:

supplying a gas including a chlorosilane compound represented by the chemical formula of $Si_3Cl_8$ and a reactant gas including to a substrate including at least one fine trench having an aspect ratio of 1 or more and a width of 1 μm or less to form the silicon-containing thin film having a uniform film thickness on a surface of the substrate including a surface of the fine trench, and wherein the silicon-containing thin film is formed by an atomic layer deposition (ALD) method, and wherein a thickness of the silicon-containing thin film is about 80 nm or less, and wherein a temperature of the substrate is maintained at a temperature from about 300° C. to about 520° C.

13. The method of claim 12, wherein the temperature of the substrate is maintained at a temperature from about 300° C. to about 440° C.

14. The method of claim 12, wherein the reactant gas includes ammonia ($NH_3$).

* * * * *